US008133325B2

(12) United States Patent
Ueda et al.

(10) Patent No.: US 8,133,325 B2
(45) Date of Patent: Mar. 13, 2012

(54) DRY CLEANING METHOD FOR PLASMA PROCESSING APPARATUS

(75) Inventors: Masahisa Ueda, Susono (JP); Yutaka Kokaze, Susono (JP); Mitsuhiro Endou, Susono (JP); Koukou Suu, Susono (JP)

(73) Assignee: ULVAC, Inc., Chigasaki-Shi (JP)

( * ) Notice: Subject to any disclaimer, the term of this patent is extended or adjusted under 35 U.S.C. 154(b) by 0 days.

(21) Appl. No.: 12/598,081

(22) PCT Filed: May 28, 2008

(86) PCT No.: PCT/JP2008/059794
§ 371 (c)(1),
(2), (4) Date: Oct. 29, 2009

(87) PCT Pub. No.: WO2008/149741
PCT Pub. Date: Dec. 11, 2008

(65) Prior Publication Data
US 2010/0083981 A1    Apr. 8, 2010

(30) Foreign Application Priority Data

May 31, 2007  (JP) .................................. 2007-145018

(51) Int. Cl.
    *C25F 1/00*    (2006.01)
(52) U.S. Cl. ............... 134/1.2; 134/1; 134/1.1; 134/1.3; 134/2; 134/21; 134/42; 438/710; 438/720; 438/726; 438/727; 438/728; 428/729; 428/730; 428/731; 428/732; 428/905; 34/92; 34/406; 216/67; 216/68; 216/69; 216/70; 216/71; 216/72; 216/73; 216/74; 216/75; 216/76
(58) Field of Classification Search ............... 134/1, 1.1, 134/1.2, 1.3, 2, 21, 42; 438/710, 720, 726–732, 438/905; 34/92, 406; 216/67–71, 74–76
See application file for complete search history.

(56) References Cited

U.S. PATENT DOCUMENTS 5,356,478 A * 10/1994 Chen et al. .................... 134/1
5,756,400 A *  5/1998 Ye et al. ...................... 438/710
(Continued)

FOREIGN PATENT DOCUMENTS

JP          8-316210         11/1996
(Continued)

OTHER PUBLICATIONS

International Search Report dated Sep. 2, 2008 issued in related International Patent Application No. PCT/JP2008/059794.

(Continued)

*Primary Examiner* — Bibi Carrillo
(74) *Attorney, Agent, or Firm* — Grossman, Tucker, Perreault & Pfleger, PLLC

(57) ABSTRACT

This dry cleaning method for a plasma processing apparatus is a dry cleaning method for a plasma processing apparatus that includes: a vacuum container provided with a dielectric member; a planar electrode and a high-frequency antenna that are provided outside the dielectric member; and a high-frequency power source that supplies high-frequency power to both the high-frequency antenna and the planar electrode, to thereby introduce high-frequency power into the vacuum container via the dielectric member and produce an inductively-coupled plasma, the method comprising the steps of: introducing a gas including fluorine into the vacuum container and also introducing high-frequency power into the vacuum container from the high-frequency power source, to thereby produce an inductively-coupled plasma in the gas including fluorine; and by use of the inductively-coupled plasma, removing a product including at least one of a precious metal and a ferroelectric that is adhered to the dielectric member.

7 Claims, 2 Drawing Sheets

U.S. PATENT DOCUMENTS

| | | | |
|---|---|---|---|
| 6,368,518 B1 * | 4/2002 | Vaartstra | 216/67 |
| 7,055,263 B2 * | 6/2006 | Wu et al. | 34/443 |
| 7,567,872 B2 * | 7/2009 | Funakubo et al. | 702/33 |
| 2003/0008517 A1 | 1/2003 | Ko et al. | |
| 2003/0013314 A1 * | 1/2003 | Ying et al. | 438/710 |
| 2004/0144489 A1 * | 7/2004 | Satoh et al. | 156/345.35 |
| 2007/0004208 A1 | 1/2007 | Ohkuni et al. | |
| 2007/0281422 A1 * | 12/2007 | Udayakumar et al. | 438/257 |

FOREIGN PATENT DOCUMENTS

| | | |
|---|---|---|
| JP | 34-29391 | 5/2003 |
| JP | 3429391 | 5/2003 |
| JP | 34293915 | 5/2003 |
| JP | 2003-273077 | 9/2003 |
| JP | 20033273077 | 9/2003 |
| JP | 2006344785 | 12/2006 |

OTHER PUBLICATIONS

Extended Search Report from corresponding EPO Application No. 08764810.1 dated Apr. 14, 2011.

* cited by examiner

DRY CLEANING METHOD FOR PLASMA PROCESSING APPARATUS

TECHNICAL FIELD

The present invention relates to a dry cleaning method for a plasma processing apparatus, and more particularly to a dry cleaning method for a plasma processing apparatus capable of efficiently removing a product adhered to a dielectric member that introduces high-frequency power into a vacuum container, and also capable of significantly decreasing particles and improving throughput, when a plasma processing apparatus is used to fabricate a memory element for a ferroelectric memory referred to as FeRAM (Ferroelectric Random Access Memory), or a piezoelectric element such as a sensor, an actuator, an oscillator, and a filter, or the like.

Priority is claimed on Japanese Patent Application No. 2007-145018, the contents of which are incorporated herein by reference.

BACKGROUND ART

Ferroelectric memory which is referred to as FeRAM is conventionally known.

The ferroelectric memory is a memory element with a multilayer structure made of a lower electrode layer, a ferroelectric layer, and an upper electrode layer. The ferroelectric memory is fabricated in the following manner (for example, see Patent Document 1). On a substrate, a foundation layer made from an insulating material is deposited. On the foundation layer, a lower electrode layer made from precious metal such as Pt, a ferroelectric layer made from PZT (Pb(Zr, Ti)$O_3$), and an upper electrode layer made from precious metal such as Pt are sequentially deposited into a multilayer film. The multilayer film is subjected to etching. In the step of etching the multilayer film, for example a plasma processing apparatus using an inductively-coupled plasma is used.

However, in the conventional plasma processing apparatus using an inductively-coupled plasma, when the multilayer film is subjected to etching, a precious metal and a ferroelectric making up the multilayer film is adhered to the dielectric member that introduces high-frequency power into the chamber (vacuum container), to thereby seal the high-frequency power. This leads to a problem in that the plasma becomes unstable. Furthermore, another problem arises in that this adhering matter is exfoliated to increase the particles of the multilayer film.

Therefore, to remove the adhering matter, impacts of ions produced when high-frequency power is applied to an electrostatically-coupled electrode are used (see Patent Document 2).

[Patent Document 1] Japanese Unexamined Patent Application, First Publication No. 2006-344785
[Patent Document 2] Japanese Patent No. 3429391

DISCLOSURE OF INVENTION

Problems to be Solved by the Invention

However, in the conventional adhering matter removal method, impact of ions takes time when, for example, the adhering matter is thick or the adhering matter is strongly adhered. This leads to a problem of lowered removal efficiency, and also to a problem of lowered throughput.

Furthermore, there is another problem in that, when a multilayer film is again deposited after the removal of the adhering matter, it is not possible to significantly decrease the number of particles even if cleaning is performed.

The present invention has been achieved in order to solve the above problems, and has an object to provide a dry cleaning method for a plasma processing apparatus capable of efficiently removing a precious metal and a ferroelectric adhered to a dielectric member that introduces high-frequency power into a vacuum container, and also capable of significantly decreasing the number of particles and improving throughput.

Means for Solving the Problem

The present inventors intensively examined dry cleaning methods for removing a product including a precious metal and/or a ferroelectric that is adhered to a dielectric member of a plasma processing apparatus. As a result, they have found that, if a product including a precious metal and/or a ferroelectric adhered to a dielectric member is removed by use of an inductively-coupled plasma, which is produced by introduction of high-frequency power into a gas including fluorine that has been introduced into a vacuum container, it is possible to efficiently remove the adhering matter, and also to significantly decrease the number of particles and to improve throughput. This led to the completion of the present invention.

That is, a dry cleaning method for a plasma processing apparatus of the present invention is a dry cleaning method for a plasma processing apparatus that includes: a vacuum container provided with a dielectric member; a planar electrode and a high-frequency antenna that are provided outside the dielectric member; and a high-frequency power source that supplies high-frequency power to both the high-frequency antenna and the planar electrode, to thereby introduce high-frequency power into the vacuum container via the dielectric member and produce an inductively-coupled plasma, the method including the steps of: introducing a gas including fluorine into the vacuum container and also introducing high-frequency power into the vacuum container from the high-frequency power source, to thereby produce an inductively-coupled plasma in the gas including fluorine; and by use of the inductively-coupled plasma, removing a product including at least one of a precious metal and a ferroelectric that is adhered to the dielectric member.

In the dry cleaning method, high-frequency power is supplied to both the high-frequency antenna and the planar electrode from the high-frequency power source, to thereby produce an inductively-coupled plasma in the gas including fluorine that has been introduced into the vacuum container. Then, the fluorine ions and radicals produced by the inductively-coupled plasma sputters a product including the precious metal and/or the ferroelectric that is adhered to the dielectric member, and also reacts with the precious metal and/or the ferroelectric to disperse the precious metal and/or the ferroelectric from the dielectric member.

As a result, adhering matter is efficiently removed from the dielectric member. This significantly decreases the number of the particles resulting from the adhering matter, and improves throughput.

It is preferable that the gas including fluorine be any one of a sulfur fluoride gas, a nitrogen fluoride gas, and a carbon fluoride gas.

It is preferable that the precious metal include one or more selected from the group consisting of platinum, iridium, ruthenium, rhodium, palladium, osmium, iridium oxide, ruthenium oxide, and strontium ruthenate.

It is preferable that the ferroelectric include one or more selected from the group consisting of PZT (Pb(Zr,Ti)O$_3$), SBT (SrBi$_2$Ta$_2$O$_9$), BTO (Bi$_4$Ti$_3$O$_{12}$), BLT ((Bi,La)$_4$Ti$_3$O$_{12}$), and BTO (BaTiO$_3$).

It is preferable that at least one of the precious metal and the ferroelectric be a constituent material of a memory element of ferroelectric memory.

It is preferable that at least one of the precious metal and the ferroelectric be a constituent material of an actuator or a piezoelectric element.

Effect of the Invention

According to the dry cleaning method for a plasma processing apparatus of the present invention, a gas including fluorine is introduced into a vacuum container, and also high-frequency power is introduced into the vacuum container from a high-frequency power source, to thereby produce an inductively-coupled plasma in the gas including fluorine. By use of the inductively-coupled plasma, a product including at least one of the precious metal and the ferroelectric that is adhered to the dielectric member is removed. Therefore, it is possible to efficiently remove the precious metal and the ferroelectric adhered to the dielectric member, and also to significantly decrease the number of particles and improve throughput.

DESCRIPTION OF THE REFERENCE SYMBOLS

Figure 1:
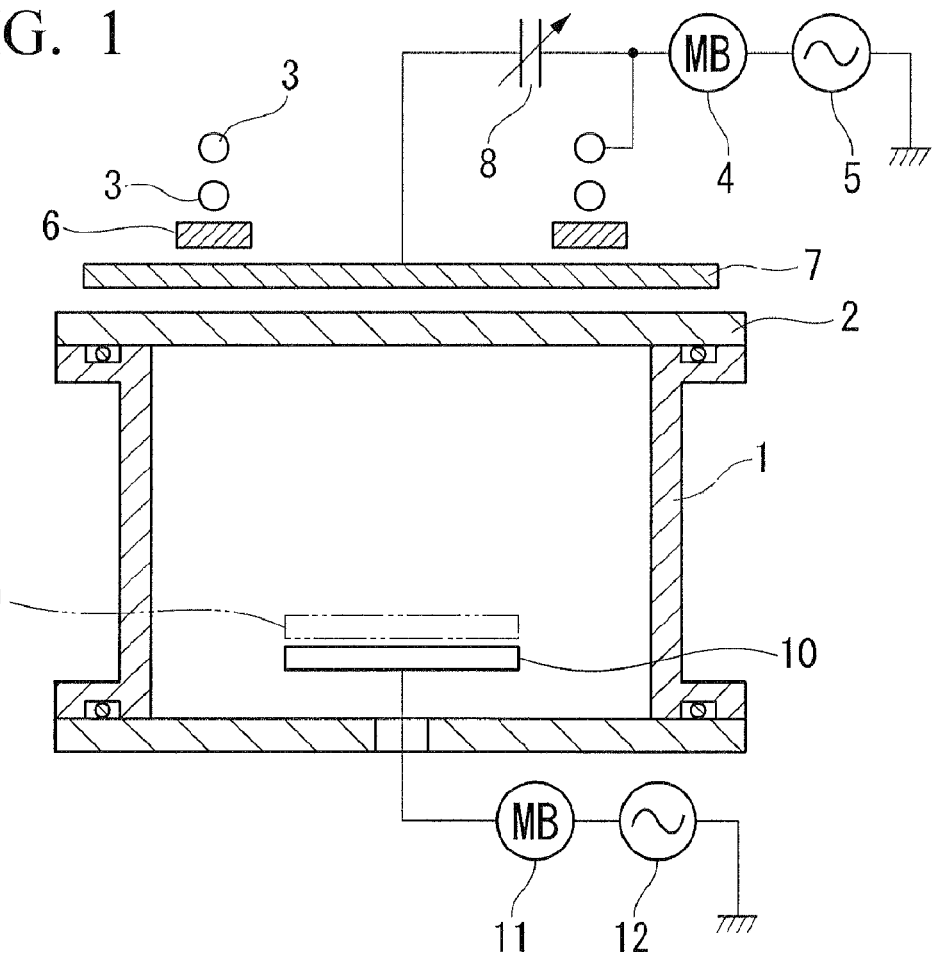
FIG. 1 is a cross-sectional view of a plasma processing apparatus that is used in application of a dry cleaning method according to one embodiment of the present invention.

1: vacuum chamber
2: silica plate
3: high-frequency loop antenna
4, 11: matching box (MB)
5: high-frequency power source
6: permanent magnet
7: planar electrode
8: variable capacitor
9: wafer
10: substrate holder
12: high-frequency power source
21, 22: linear metal material

BEST MODE FOR CARRYING OUT THE INVENTION

Hereunder is a description of one embodiment for carrying out a dry cleaning method for a plasma processing apparatus of the present invention.

Note that the present embodiment is a specific description for better understanding of the spirit and scope of the invention. Therefore, the present invention is not limited by the embodiment unless otherwise specified.

FIG. 1 is a cross-sectional view of a plasma processing apparatus using a inductively-coupled plasma, which is used when a dry cleaning method for a plasma processing apparatus according to the present embodiment is carried out.

In FIG. 1, reference numeral 1 denotes a vacuum chamber (a vacuum container) that defines a processing chamber of the plasma processing apparatus. Reference numeral 2 denotes a silica plate, a dielectric member that is airtightly attached to an upper opening of the vacuum chamber 1, to thereby form a window. Reference numeral 3 denotes a high-frequency loop antenna formed in a loop with two turns parallel to the silica plate 2. The high-frequency loop antenna is provided outside the silica plate 2. Reference numeral 4 denotes a matching box (MB) connected to the high-frequency loop antenna 3 and provided with a matching circuit. Reference numeral 5 denotes a high-frequency power source connected to the matching box 4.

Reference numeral 6 denotes a plurality of plate-like permanent magnets arranged under the high-frequency loop antenna 3 so as to be orthogonal to the current flowing through the high-frequency loop antenna 3 and also to form a loop parallel to the silica plate 2. Reference numeral 7 denotes a planar electrode provided between the silica plate 2 and the permanent magnets 6. Reference numeral 8 denotes a variable capacitor that allows its capacitance to be adjusted to an optimum value (10 pF to 500 pF). Reference numeral 9 denotes a wafer which is subjected to plasma processing. Reference numeral 10 denotes a substrate holder 10 for supporting the wafer 9. Reference numeral 11 denotes a matching box (MB) connected to the substrate holder 10 and provided with a matching circuit. Reference numeral 12 denotes a high-frequency power source connected to the matching box 11.

The planar electrode 7 is made from a linear metal material with a planar shape. It is formed in accordance with the shape of the window formed by the silica plate 2. It is spaced not more than 50 mm parallelwise from the silica plate 2.

Figure 2:
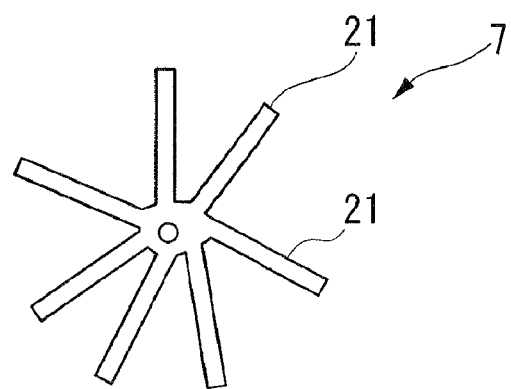
FIG. 2 is a plan view showing one example of a planar electrode provided in the plasma processing apparatus.
Figure 3:
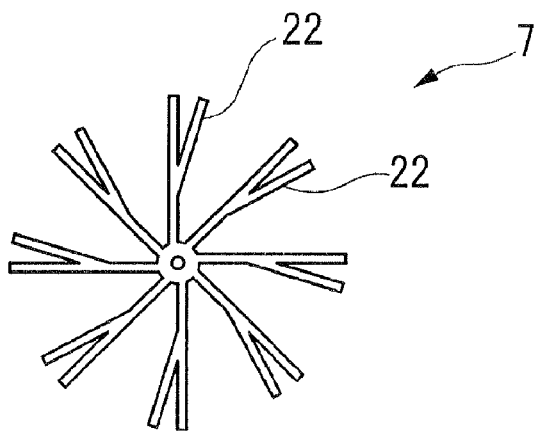
FIG. 3 is a plan view showing another example of shape of the planar electrode.

The planar electrode 7 has a star shape in which a plurality of linear metal materials 21 radially extend from the center as shown in FIG. 2, or a star shape in which a plurality of linear metal materials 22 with their ends branched radially extend from the center as shown in FIG. 3.

Adoptable shapes of the planar electrode 7 other than a star shape include a comb shape.

Next is a description of a dry cleaning method for the plasma processing apparatus.

After deposition of a memory element made of a multilayer film of ferroelectric memory that is referred to as FeRAM, a product produced when the multilayer film is subjected to etching is adhered to the inside of the silica plate 2.

The product includes a precious metal and/or a ferroelectric. The precious metal includes one or more selected from the group consisting of platinum, iridium, ruthenium, rhodium, palladium, osmium, iridium oxide (IrO$_2$), ruthenium oxide (RuO$_2$), and strontium ruthenate (SrRuO$_3$).

The ferroelectric includes one or more selected from the group consisting of PZT (Pb(Zr,Ti)O$_3$), SBT (SrBi$_2$Ta$_2$O$_9$), BTO (Bi$_4$Ti$_3$O$_{12}$), BLT ((Bi,La)$_4$Ti$_3$O$_{12}$), and BTO (BaTiO$_3$).

To remove the product, a dummy wafer is introduced into the vacuum chamber 1. Then, a gas including fluorine as a cleaning gas is introduced thereinto, and also high frequency power is introduced to both the high-frequency loop antenna 3 and the planar electrode 7 from the high-frequency power source 5, to thereby produce an inductively-coupled plasma in the gas including fluorine that has been introduced into the vacuum chamber 1.

As the gas including fluorine, any one of a sulfur fluoride gas, a nitrogen fluoride gas, and a carbon fluoride gas is preferable.

Sulfur fluoride gases include sulfur monofluoride ($S_2F_2$), sulfur difluoride ($SF_2$), sulfur tetrafluoride ($SF_4$), sulfur pentafluoride ($S_2F_{10}$), and sulfur hexafluoride ($SF_6$). Among these, especially sulfur hexafluoride ($SF_6$) is preferable because it is capable of easily producing a fluoride of a precious metal and/or a ferroelectric as a result of reaction with the precious metal and/or the ferroelectric at warm temperatures and under low pressures.

Nitrogen fluoride gases include nitrogen monofluoride ($N_2F_2$) and nitrogen trifluoride ($NF_3$). Among these, especially nitrogen trifluoride ($NF_3$) is preferable because it is capable of easily producing a fluoride of a precious metal and/or a ferroelectric as a result of reaction with the precious metal and/or the ferroelectric at warm temperatures and under low pressures.

Carbon fluoride gases include perfluoromethane ($CF_4$), perfluoroethane ($C_2F_6$), perfluoropropane ($C_3F_8$), hexafluorobutane ($C_4F_6$), octafluorocyclobutane ($C_4F_8$), perfluorocyclopentene ($C_5F_8$). Among these, especially perfluoromethane ($CF_4$), perfluoroethane ($C_2F_6$), or the like, which has low molecular weight, is preferable because it is capable of easily producing a fluoride of a precious metal and/or a ferroelectric as a result of reaction with the precious metal and/or the ferroelectric at warm temperatures and under low pressures.

It is preferable that the gas including fluorine have a flow rate of not less than 20 sccm and not more than 100 sccm.

In addition, it is preferable that the gas including fluorine have a pressure of not less than 0.3 Pa and not more than 5 Pa.

With the production of an inductively-coupled plasma in the gas including fluorine, fluorine ions and radicals are produced. The fluorine ions and radicals sputter the product including the precious metal and/or the ferroelectric that is adhered to the silica plate 2. Then, they react with the precious metal and/or the ferroelectric to produce a fluoride of element (s) making up the precious metal and/or the ferroelectric.

As the fluoride, one with a boiling point (bp) or a melting point (mp) lower than that of the element(s) making up the precious metal and/or the ferroelectric is preferable. For example, adoptable fluorides include iridium (VI) fluoride ($IrF_6$) (mp=44.4° C., bp=53° C.), platinum (II) fluoride ($PtF_2$), platinum (IV) fluoride ($PtF_4$), zirconium (IV) fluoride ($ZrF_4$), titanium(III) fluoride ($TiF_3$), titanium (IV) fluoride ($TiF_4$).

Each of these fluorides has a comparatively weak bonding force with the product. Hence, sputtering exfoliates the fluoride from the product with ease. Therefore, it is possible to disperse the fluoride from the silica plate 2 with ease.

In this manner, the adhering matter is efficiently removed from the silica plate 2. Therefore, the number of particles resulting from the adhering matter is significantly decreased, and throughput is improved.

As described above, it is possible to efficiently remove the precious metal and ferroelectric from the silica plate 2, and also to significantly decrease the number of particles and improve throughput.

Figure 4:
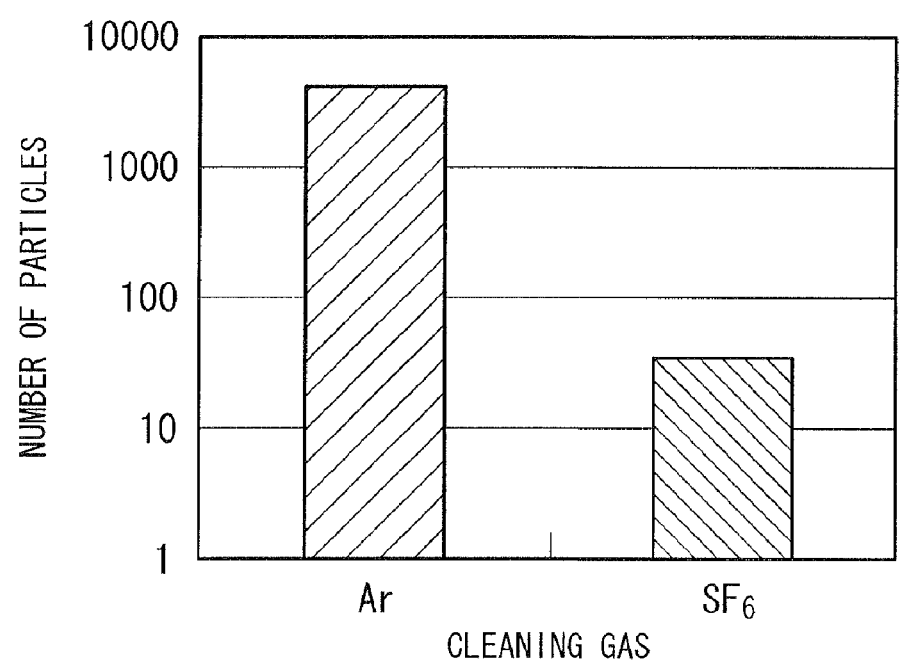
FIG. 4 is a graph showing the number of particles after cleaning.

FIG. 4 is a graph showing one embodiment to which the present invention is adopted. It shows the number of particles after cleaning. To be more specific, twenty-five 8-inch wafers were subjected to plasma processing. Then, a dummy wafer was introduced, and dry cleaning was done by use of an argon (Ar) gas or a sulfur hexafluoride ($SF_6$) gas. Subsequently, a wafer for counting particles was introduced, which was subjected to plasma processing. The graph shows the number of particles on the wafer.

In FIG. 4, Ar represents the number of particles when dry cleaning was done with an Ar gas (50 sccm, 0.5 Pa) being introduced into the above plasma processing apparatus. At that time, the high-frequency loop antenna 3 had high-frequency power of 1000 W, with a bias of 100 W for 30 minutes. The number is approximately 4000.

On the other hand, $SF_6$ represents the number of particles when dry cleaning was done with an $SF_6$ gas (50 sccm, 0.5 Pa) being introduced into the above plasma processing apparatus. At that time, the high-frequency loop antenna 3 had high-frequency power of 1000 W, with a bias of 100 W for 30 minutes. The number is not more than 50.

According to the above embodiment, it is found that use of the $SF_6$ gas has significantly decrease the number of particles compared with the case where the Ar is used.

Furthermore, an observation of the surface state of the silica plate 2 before and after the dry cleaning has revealed this. The surface state of the silica plate 2 before the dry cleaning had large asperities due to the adherence of the product. On the other hand, the surface state of the silica plate 2 after the dry cleaning was excellent in flatness, with the adherence of the product scarcely found.

As described above, according to the dry cleaning method for the plasma processing apparatus of the present embodiment, a gas including fluorine is introduced into the vacuum chamber 1, and high-frequency power is supplied to both the high-frequency loop antenna 3 and the planar electrode 7 from the high-frequency power source 5, to thereby produce an inductively-coupled plasma in the gas including fluorine that has been introduced into the vacuum chamber 1. The inductively-coupled plasma sputters a product including the precious metal and/or ferroelectric on the silica plate 2, and also reacts with the precious metal and/or the ferroelectric to produce fluoride of the element(s) making up the precious metal and/or the ferroelectric. As a result, it is possible to efficiently remove the precious metal and the ferroelectric adhered to the silica plate 2, and also to significantly decrease the number of particles and improve throughput.

In the dry cleaning method for a plasma processing apparatus of the present embodiment, the description has been for the case where a product including a precious metal and/or a ferroelectric that is adhered to the inside of the silica plate 2 when a memory element made of a multilayer film of ferroelectric memory referred to as FeRAM is deposited, is removed by dry cleaning, by way of example. In another case where a product including the precious metal and/or ferroelectric that are materials making up an actuator or a piezoelectric element is removed by dry cleaning, the present invention is capable of having a similar effect.

INDUSTRIAL APPLICABILITY

According to the present invention, it is possible to provide a dry cleaning method for a plasma processing apparatus capable of efficiently removing a precious metal and a ferroelectric adhered to the dielectric member that introduces high-frequency power into a vacuum container, and also capable of significantly decreasing the number of particles and improving throughput.

What is claimed is:

1. A dry cleaning method for a plasma processing apparatus having: a vacuum container provided with a dielectric member; a planar electrode and an antenna that are provided outside the dielectric member; and a power source that supplies power to both the antenna and the planar electrode, to thereby introduce power into the vacuum container via the dielectric member and produce an inductively-coupled plasma, the method consisting the steps of:

introducing a gas consisting of fluorine having a flow rate of not less than 20 sccm and not more than 100 sccm into the vacuum container and also introducing power into the vacuum container from the power source, to thereby produce an inductively-coupled plasma in the gas consisting of fluorine having a pressure of not less than 0.3 Pa and not more than 5 Pa; and by use of the inductively-coupled plasma, removing a product including at least one of a precious metal and a ferroelectric that is adhered to the dielectric member.

2. The dry cleaning method for the plasma processing apparatus according to claim 1, wherein the gas consisting of fluorine is selected from the group consisting of sulfur fluoride gas, a nitrogen fluoride gas, and a carbon fluoride gas.

3. The dry cleaning method for the plasma processing apparatus according to claim 1, wherein
the precious metal includes one or more selected from the group consisting of platinum, iridium, ruthenium, rhodium, palladium, osmium, iridium oxide, ruthenium oxide, and strontium ruthenate.

4. The dry cleaning method for the plasma processing apparatus according to claim 1, wherein the ferroelectric includes one or more selected from the group consisting of PZT ($Pb(Zr,Ti)O_3$), SBT ($SrBi_2Ta_2O_9$), $Bi_4Ti_3O_{12}$, BLT (($Bi,La)_4Ti_3O_{12}$), and $BaTiO_3$.

5. The dry cleaning method for the plasma processing apparatus according to claim 1, wherein
at least one of the precious metal and the ferroelectric is a constituent material of a memory element of ferroelectric memory.

6. The dry cleaning method for the plasma processing apparatus according to claim 1, wherein
at least one of the precious metal and the ferroelectric is a constituent material of a piezoelectric element.

7. The dry cleaning method for the plasma processing apparatus according to claim 6, wherein
the piezoelectric element includes an actuator.

* * * * *